US007566952B2

(12) United States Patent
Floyd et al.

(10) Patent No.: US 7,566,952 B2
(45) Date of Patent: Jul. 28, 2009

(54) ON-CHIP CIRCUIT PAD STRUCTURE

(75) Inventors: Brian A. Floyd, Cortland Manor, NY (US); Ullrich R. Pfeiffer, Carmel, NY (US); Scott K. Reynods, Granite Springs, NY (US)

(73) Assignee: International Business Machines Corporation, Armonk, NY (US)

( * ) Notice: Subject to any disclaimer, the term of this patent is extended or adjusted under 35 U.S.C. 154(b) by 204 days.

(21) Appl. No.: 11/029,518

(22) Filed: Jan. 5, 2005

(65) Prior Publication Data

US 2006/0145308 A1    Jul. 6, 2006

(51) Int. Cl.
*H01L 23/525* (2006.01)

(52) U.S. Cl. .................. 257/665; 333/33; 257/E21.592

(58) Field of Classification Search .................. 333/33, 333/263, 26; 257/706, 630, 661–669, 782, 257/E21.592
See application file for complete search history.

(56) References Cited

U.S. PATENT DOCUMENTS

| 5,025,232 | A | * | 6/1991 | Pavio .......................... 333/26 |
| 7,061,100 | B2 | | 6/2006 | Iwaki et al. |
| 7,190,244 | B2 | * | 3/2007 | Hettak ......................... 333/263 |
| 2004/0012457 | A9 | * | 1/2004 | Soltan et al. .................. 333/33 |

* cited by examiner

*Primary Examiner*—Nathan W Ha
(74) *Attorney, Agent, or Firm*—Vazken Alexanian

(57) ABSTRACT

Shielded circuit pad is provided where the parasitic capacitance is tuned out by the inclusion of a shunt transmission line stub which reduces the substrate induced loss in millimeter-wave applications. The circuit pad is located on the substrate, with a shield located beneath the circuit pad, and the shunt transmission line stub attached to the circuit pad. Accordingly, controlled impedance is obtained for millimeter-wave applications. The spacing between the circuit pad and the shield may then be minimized.

11 Claims, 8 Drawing Sheets

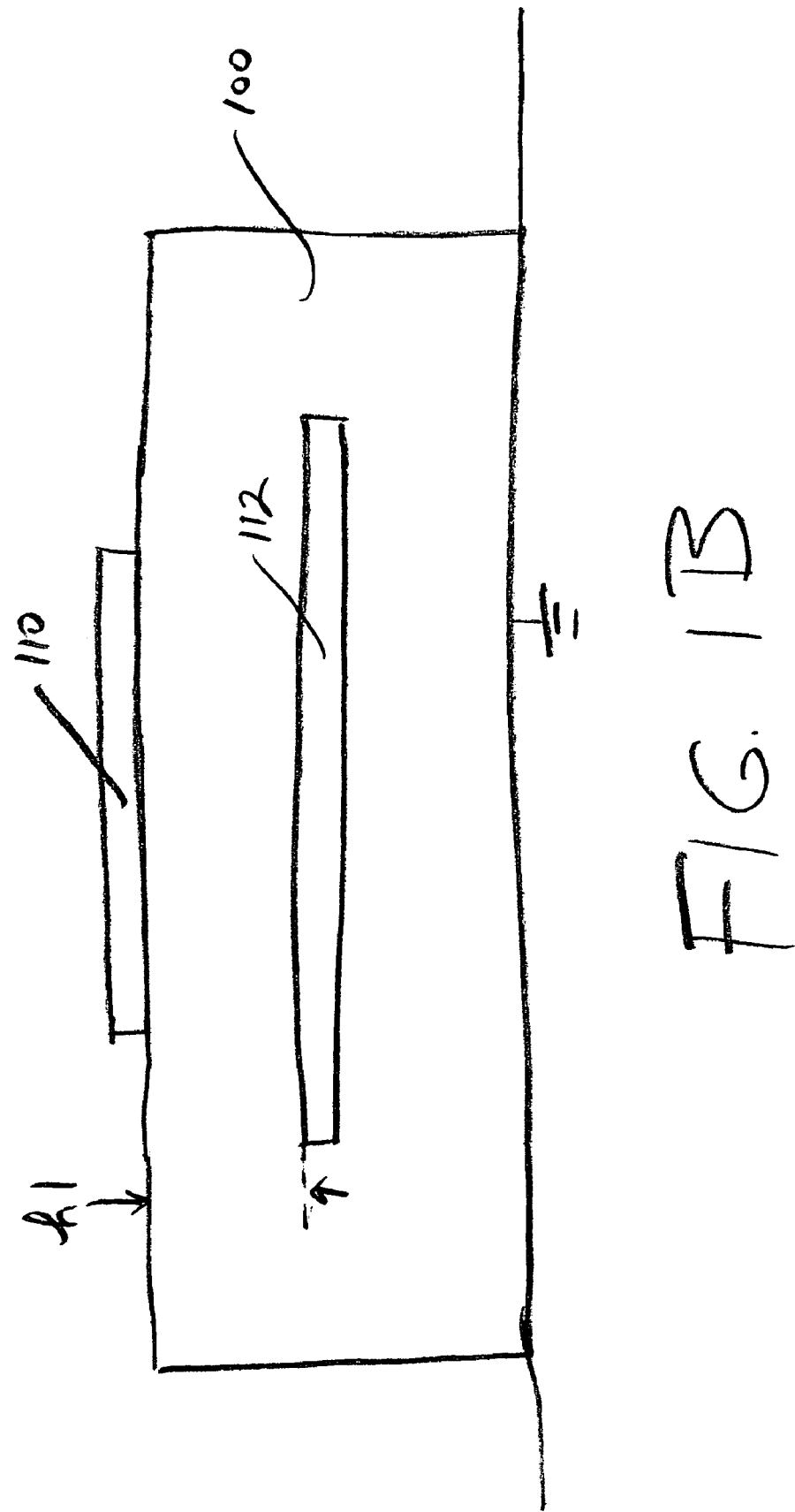

ON-CHIP CIRCUIT PAD STRUCTURE

TECHNICAL FIELD OF THE INVENTION

The present invention relates generally to on-chip circuit pads for circuit operation in the millimeter-wave frequency range, and in particular, to on-chip circuit pads used on lossy substrates to improve substrate induced losses.

BACKGROUND

Electronic products operating in the millimeter-wave frequency range may be based on gallium arsenide (GaAs) or indium phosphide (InP) semiconductor technologies to provide the speed and power necessary for applications such as personal-area networks and automotive radars, for example. However, to reduce cost and power consumption, the system sizes of these gallium arsenide (GaAs) or indium phosphide (InP) based semiconductor products are required to be dramatically reduced.

It has been demonstrated that silicon germanium (SiGe) process technologies are well positioned to provide the speed and power solutions in the millimeter-wave frequency range, such as for highly integrated radio circuits, for example. However, standard silicon substrates usually have a low resistivity and therefore the substrate may greatly impact the signal loss of on-chip interconnects at millimeter-wave frequencies. Thus, at millimeter-wave frequencies, the lossy substrate may greatly impact the signal loss of input/output connections (IOs), for example, depending on the physical size of the input/output connections.

Input/output connections such as on-chip circuit pads are designed for lower frequency operation. FIGS. 1A-B show respectively a front view and a side view of an exemplary embodiment of an on-chip circuit pad provided on a substrate. As shown in FIGS. 1A-B, an on-chip circuit pad may consist of a top-metal plate 110 having an octagonal shape, for example. It should be appreciated that the pad is large enough, such as 100×100 μm, to provide the spatial structure for wire-bond or flip-chip ball packaging, for example.

As shown in FIGS. 1A-B, the circuit pad 110 is provided on a substrate 100, wherein a solid metal shield 112 is provided below the circuit pad 110 to reduce loss induced by the substrate 100. In the embodiment shown in FIGS. 1A-B, a spacing h1 between circuit pad 110 and the metal shield 112 is provided on the substrate 100 and is maximized to minimize the parasitic capacitance formed between the circuit pad 110 and the metal shield 112. That is, as the spacing h1 increases, the parasitic capacitance decreases.

As shown in FIGS. 1A-B, a feed line 114 is provided to connect the pad structure to an on-chip circuitry such as an input buffer or an output driver. In a typical communication system, the structure may be a low noise amplifier or a power amplifier.

SUMMARY OF THE INVENTION

Operating in the millimeter-wave frequency range, providing a solid metal shield directly below an on-chip circuit pad as in the exemplary embodiment of FIGS. 1A-B is usually not desired because of the large parasitic capacitance of the structure.

Accordingly, in accordance with the various exemplary embodiments of the present invention, improved shielded circuit pads are provided where the parasitic capacitance is tuned out by the inclusion of shunt transmission line stubs. The line stubs may be included to effectively void the pad capacitance and the combined structure represents only a high impedance node between off-chip sources and the on-chip circuitry. This way, the shield does not impact the circuit performance in any way and may be used without further considerations to reduce substrate induced losses in millimeter-wave applications.

In accordance with the various exemplary embodiments of this invention, a device is provided, including a substrate, a circuit pad located on the substrate, a shield located beneath the circuit pad, and a shunt transmission line stub attached to the circuit pad.

In accordance with the various exemplary embodiments of this invention, a method of tuning out parasitic capacitance is provided.

In accordance with these exemplary embodiments, the method includes the steps of determining the pad capacitance, determining the required stub length to be connected to the circuit pad, inputting the external source or load impedance and providing the external source or load impedance as the impedance for the on-chip feed line.

In accordance with the various exemplary embodiments of this invention, controlled impedance is obtained for millimeter-wave applications. That is, since the tuned circuit pad represents a high impedance node, the circuit pad may be regarded as electrically transparent in the band of operation. The off-chip load or source impedance is therefore not altered in any way and will be seen at the input to the feed line. That is, if the on-chip feed line is chosen in such a way that it has the same characteristic line impedances as the off-chip source or load impedance, then the off-chip source or load impedance will also be visible at the other end of the feed line where it is connected to the on-chip circuits. This impedance will be independent of the length of the feed line. Therefore the length of the feed-line does not matter and does not have to be considered in any impedance matching network.

Thus, in accordance to various exemplary embodiments of this invention, the length of the feed line may have any length required to connect an on-chip circuit to the circuit pad.

In accordance wit the various exemplary embodiments of this invention, the spacing between the circuit pad and the shield may be minimized without any harm to the on-chip circuit.

These and other exemplary embodiments, aspects, objects, features and advantages of the present invention will be described or become apparent from the following detailed description of exemplary embodiments, which is to be read in connection with the accompanying drawings.

BRIEF DESCRIPTION OF THE DRAWINGS

FIGS. 1A-B show respectively a front view and a side view of an exemplary known embodiment of an on-chip circuit pad provided on a substrate.

DETAILED DESCRIPTION OF EXEMPLARY EMBODIMENTS

Figure 2A:
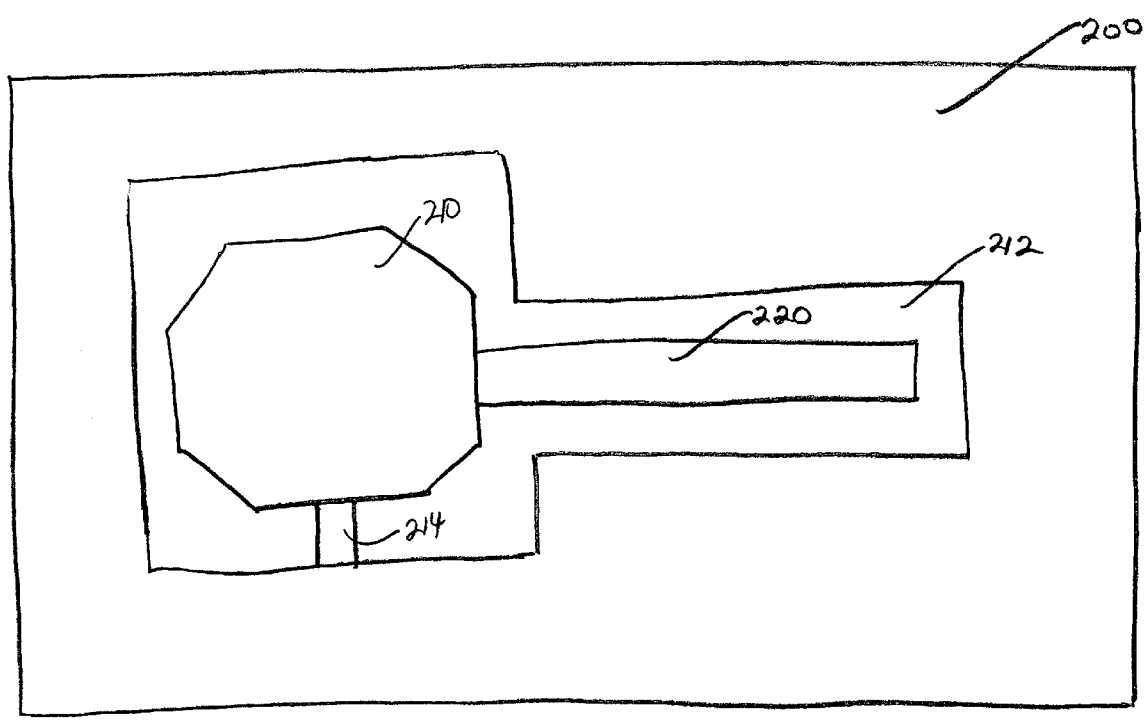
FIGS. 2A-B show respectively a front view and a side view of an exemplary embodiment of an on-chip circuit pad with a shunt transmission line stub provided on a substrate according to the present invention.
Figure 2B:
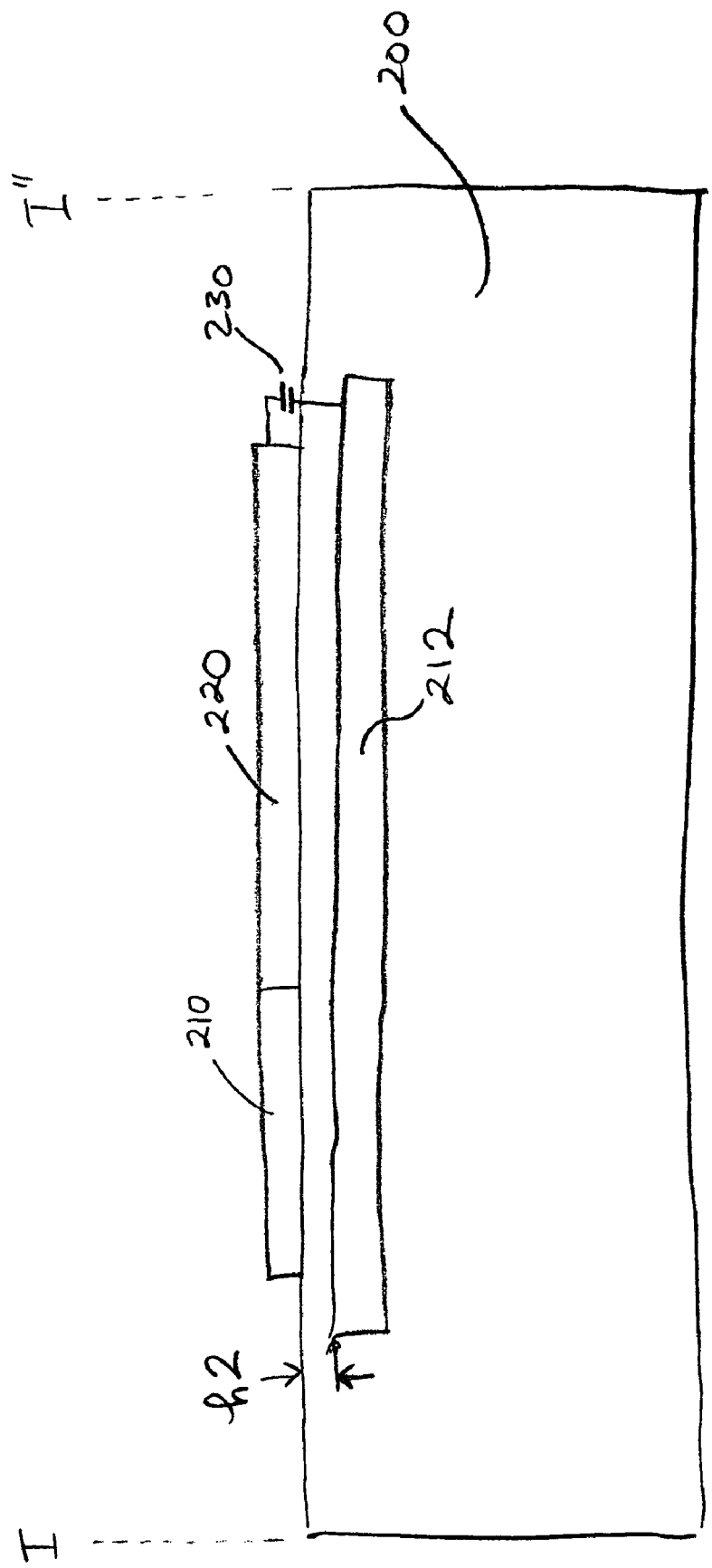

FIGS. 2A-B show respectively a front view and a side view of an exemplary on-chip circuit pad and a transmission line stub attached thereto provided on a substrate, according to an exemplary embodiment of the present invention. More specifically, FIGS. 2A and 2B illustrate an exemplary on-chip circuit pad 210 and transmission line stub 212 provided on a lossy substrate 200, wherein FIG. 2A schematically illustrates a top plan view of the substrate 200 and FIG. 2B is a schematic cross-sectional view of the substrate 200 of FIG. 2A taken along line I-I'.

Figure 1A:
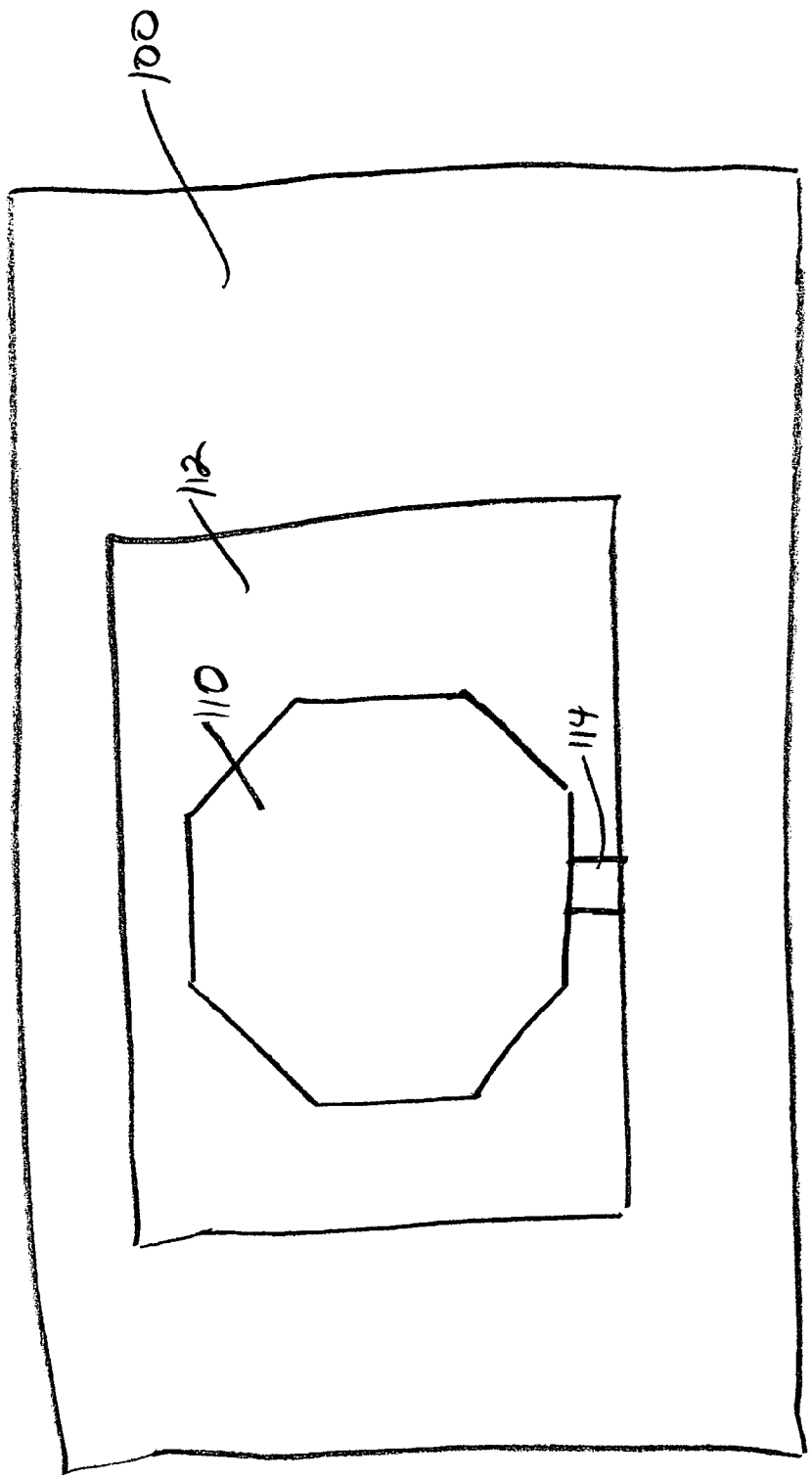

Referring now to FIGS. 2A and 2B, the circuit pad 210 is provided on the substrate 200 based on the exemplary framework of FIGS. 1A-B. It should be appreciated that the substrate 200 may comprise any suitable material including, for example, dielectric/insulative materials such as fused silica ($SiO_2$), alumina, polystyrene, ceramic, teflon based substrates, FR4, and the like, or semiconductor materials such as low or high resistivity silicon or gallium arsenide (GaAs), indium phosphide (InP), and the like.

It should be appreciated that in accordance to the various exemplary embodiments of the invention, lossy substrates may be applied as the substrate 200 since a loss-less substrate would not necessarily require a shield. Thus, the exemplary embodiments enables inexpensive lossy substrates to be used.

It should also be appreciated that, in accordance with the various exemplary embodiments of the invention, the circuit pad 210 may be very broad band not at very low frequencies, such as DC to 100 GHz, but within a frequency band that is wide enough to cover the operation bands of typical communication systems. For example, in various embodiments, the bandwidth may cover from 50 to 70 GHz.

As shown in FIGS. 2A-B, the circuit pad 210 is provided with a transmission line stub 220 attached thereto. In the exemplary embodiment shown in FIGS. 2A-B, a metal shield 212 is provided beneath the circuit pad 210 and the transmission line stub 220. The metal shield 212 is provided beneath the circuit pad 210 and the transmission line stub 220, by a spacing h2, to reduce loss to the circuit pad 210 induced by the lossy substrate 200. The circuit pad 210 and transmission line stub 220 along with the metal shield 212 may be formed as part of the top metallization layer of the substrate 200.

Due to the addition of the transmission line stub 220, instead of a square-shape shield as shield 120 in FIGS. 1A-B, the shield 212 of FIGS. 2A-B is used which includes a protruding portion beneath the transmission line stub 220. However, it should be appreciated that the shield 212 is not limited to the exemplary shape shown in FIGS. 2A-B according to the various exemplary embodiments of the present invention, and that any shape which provide the shielding function to shield the circuit pad 210 and the transmission line stub 220 may be used.

As shown in FIG. 2A, a feed line 214 is provided to provide on-chip feed to the circuit pad 210. The feed line 214 is provided to connect the pad structure to an on-chip circuitry such as an input buffer or an output driver. In a typical communication system, the pad structure may be a low noise amplifier or a power amplifier. At millimeter wave frequencies, the feed line 214 may be made out of transmission lines having a characteristic impedance (Z0) to minimize signal dispersion or unwanted reflection. The dimension, such as length and width, of the feed line 214 may be chosen such that in combination with the pad capacitance an optimum impedance match from the external, off-chip, source to the integrated on-chip circuits is achieved. It should be appreciated that additional matching elements such as capacitors, inductors, or transmission-lines may be required to achieve an impedance match for a specific circuit In accordance with the various exemplary embodiments of the present invention, the transmission line stub 220 is shunted to tune out unwanted parasitic capacitance to reduce loss induced by the lossy substrate. Accordingly, the parasitic capacitance may be tuned out irrespective of the spacing h2 between the circuit pad 210 and the shield 212. Thus, the spacing h2 may be minimized to implement an effective shield within the metal stack of a semiconductor backend of the line. For example, a thicker metal layer, such as a copper layer, closer to the circuit pad 210 may be chosen to provide a lower resistive ground shield.

As shown in FIG. 2B, the transmission line stub 220 may be shorted to the ground shield 212 at the end by means of a capacitor 230 or a straight via. It should be appreciated that a simple via may be used in applications, where the input and output signals are AC coupled, and that in case of DC coupled input or output signals, a shunt capacitor is desired to prevent shorts.

As discussed, by shorting the transmission line stub 220, at millimeter-wave frequencies, the unwanted parasitic capacitance is reduced to zero, or tuned out. At such millimeter wave frequencies, the length of the shunt transmission line stub 220 may be chosen such that the structure is of a real impedance at the center frequency of operation with sufficient bandwidth. The tuning makes the circuit pad 210 electrically transparent at the center frequency. The further away the frequency gets from its center frequency, the less transparent the circuit pad 210 will be. However, since the pad and stub capacitance has a very low quality factor, the combined structure may have a very wide bandwidth. On-chip transmission-lines with similar characteristic impedance may therefore be connected to the circuit pad 210 to transmit the input/ouput signals to any location on-chip without the need for re-matching the impedance.

In accordance with the various exemplary embodiments of this invention, controlled impedance is obtained for millimeter-wave applications. That is, since the tuned circuit pad 210 represents a high impedance node, the circuit pad 210 may be regarded as electrically transparent in the band of operation. The off-chip load or source impedance is therefore not altered in any way and will be seen at the input to the feed line 214.

In various applications, the external off-chip source or load impedance may be chosen to be 50 Ohm. If the on-chip feed line 214 is chosen in such a way that it has the same characteristic line impedance of 50 Ohm as the off-chip source or load impedance, then the off-chip source or load impedance will also be visible at the other end of the feed line 214 where it is connected to on-chip circuits. This impedance will be independent of the length of the feed line 214 which in general is not the case if the input of a transmission line is capacitive like in prior art pads. Therefore the length of the feed line 214 does not matter and does not have to be considered in any impedance matching network. In practical chip layouts, this design is very convenient since the length of the feed line 214 may have any length required to connect on-chip circuits to the circuit pad 210.

It should be appreciated that, in accordance with the various exemplary embodiments of this invention, the length of the transmission line stub 220 is chosen such that the pad capacitance is resonated. That is, different circuit pads 210 require a longer or shorter stub 220.

Figure 3:
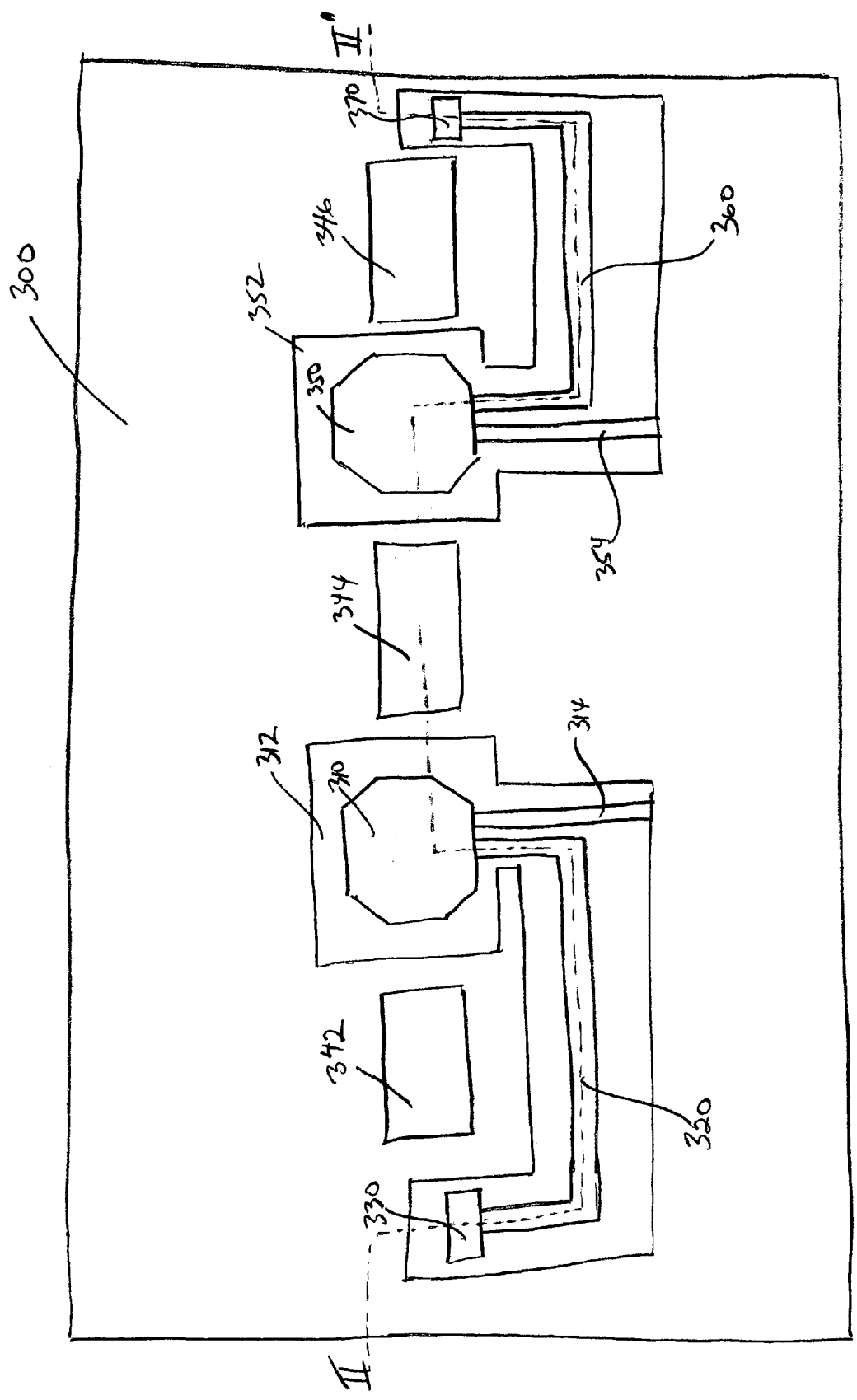
FIG. 3 shows one exemplary embodiment of the present invention where two circuit pads have been combined for a differential pad structure.

FIG. 3 shows one exemplary embodiment of the present invention where two circuit pads have been combined to form a differential pad structure. In the exemplary embodiment shown in FIG. 3, the differential circuit is provided with a ground-signal-ground configuration, widely used in millimeter-wave applications. However, it should be appreciated that the embodiments of the present invention are not limited to this ground-signal-ground configuration, and that other configurations may be applied in accordance to this invention.

As shown in FIG. 3, circuit pads 310 and 350 are provided on a substrate 300, with shunt stubs 320 and 360 respectively attached thereto. The transmission line may be shorted at the ends by means of a capacitor 330 and 370 provided respectively thereto. In the exemplary embodiment shown in FIG. 3, the stubs 320 and 360 are bent to reduce space usage. However, it should be appreciated that the exemplary embodiments of the present invention are not limited to any particular structure.

Metal shields 312 and 352 are respectively provided beneath circuit pads 310 and 350, and stubs 320 and 360. As shown in FIG. 3, the shapes of the shields 312 and 352 are determined by the shapes of the circuit pads 310 and 350 and the stubs 320 and 360. Feed lines 314 and 354 are provided to circuit pads 310 and 350, respectively.

In the exemplary embodiment shown in FIG. 3, the circuit pads 310 and 350 are provided in a ground-signal-ground configuration, wherein the circuit pads 310 and 350 are alternatively provided between ground pads 342, 344 and 346.

For illustrative purposes, exemplary embodiments of the invention will be described with specific reference to the substrate and integration of such substrate in semiconductor integrated circuit packages. It is to be understood, however, that the invention is more generally applicable to any integration of the substrate that is suitable for a given application and/or frequency of operation, for example.

Figure 4:
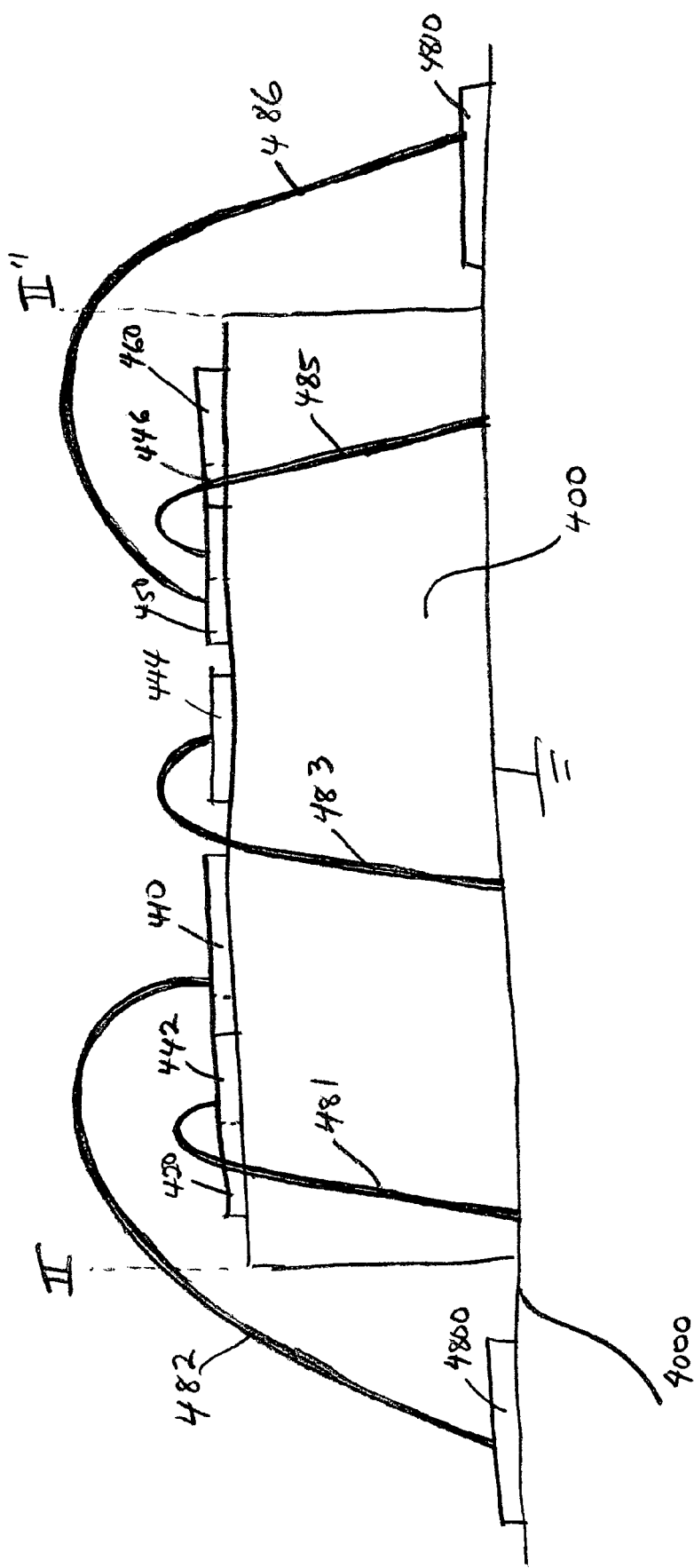
FIG. 4 shows an exemplary substrate according to one exemplary embodiment of the present invention integrated in an exemplary semiconductor integrated circuit package using a wirebonding technology.

More specifically, FIG. 4 illustrates an integration of an exemplary substrate according to an exemplary embodiment of the present invention integrated in a semiconductor integrated circuit package. As shown in FIG. 4, the substrate 400 is a chip integrated in a circuit package via wire bonds, for example. In general, bonding is commonly used in semiconductor fabrication for making chip-to-substrate interconnections to provide electrical paths for power and signal distribution. As shown in FIG. 4, wire bonding is provided to connect the circuit pads 410 and 450 and grounding pads 442, 444 and 446 on the substrate 400 to a lead frame 4000.

In the exemplary embodiment shown in FIG. 4, grounding pads 442, 444 and 446 are connected to the grounded lead frame 4000 via wire elements 481, 483 and 485, respectively, to provide ground connection. Circuit pads 410 and 450 are connected to connection pads 4800 and 4810 via wire elements 482 and 486, respectively, to provide positive and negative electrical paths, respectively.

In the exemplary embodiment shown in FIG. 4, wire elements 481-486 are to be attached to the surface of the substrate 400 on one end and the to the surface of the lead frame 4000 at the other end. It should be understood that the present invention is not limited to the wire-bonding structure shown in FIG. 4, and that other structures, such as flip-chip ball bonding, for example, may be used.

Figure 5:
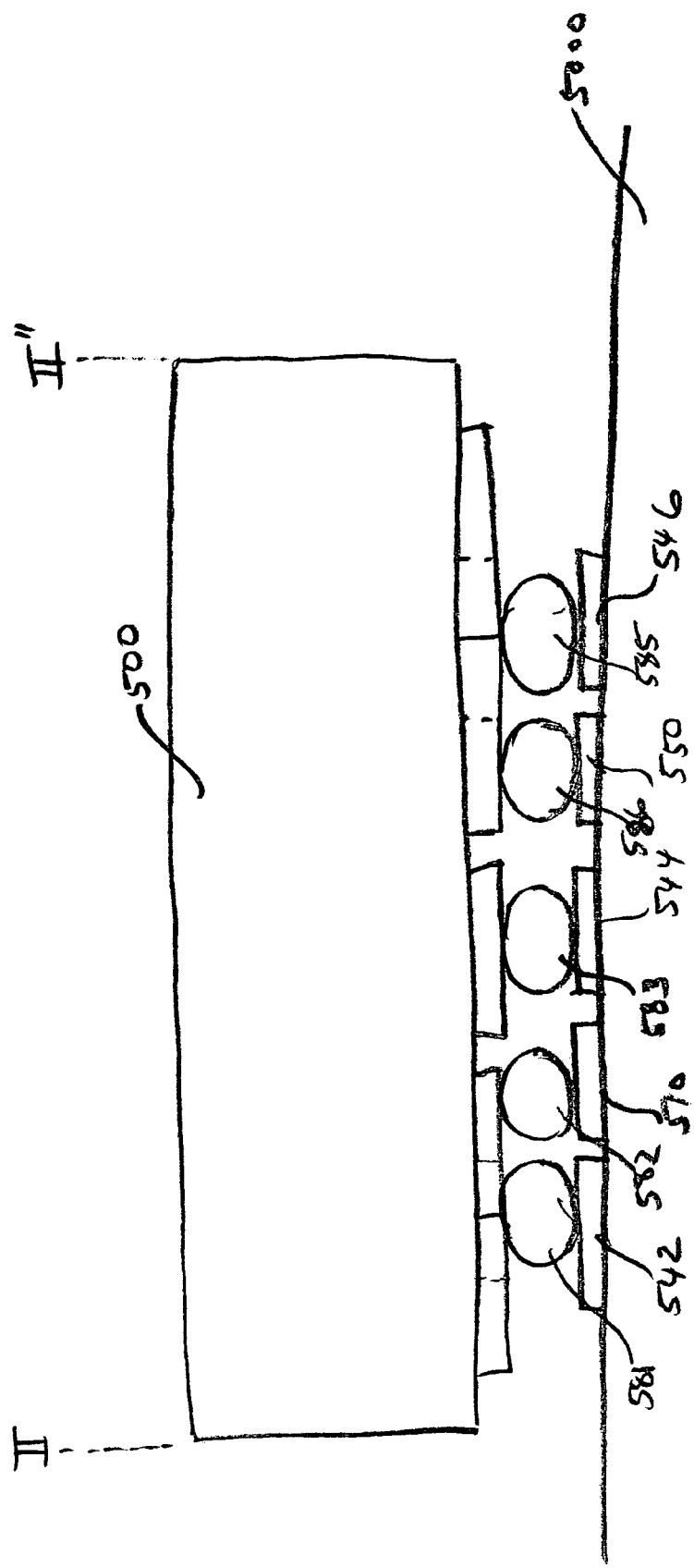
FIG. 5 shows an exemplary substrate according to one exemplary embodiment of the present invention integrated in yet another exemplary semiconductor integrated circuit package using a flip-chip bonding technology.

For example, FIG. 5 illustrates yet another integration of a substrate according to an exemplary embodiment of the present invention in a semiconductor integrated circuit package.

More specifically, FIG. 5 illustrates a substrate 500 as a chip integrated in a circuit package via flip-chip ball bonds, for example, to provide electrical paths for power and signal distribution. As shown in FIG. 5, flip-chip ball bonding is provided to connect the circuit pads 510 and 550 and grounding pads 542, 544 and 546 on the substrate 500 to a lead frame 5000 (not shown in the figure).

In the exemplary embodiment shown in FIG. 5, grounding pads 542, 544 and 546 are connected to the grounded lead frame 5000 via grounded balls 581, 583 and 585, respectively, to provide ground connection. Circuit pads 510 and 550 are connected to positive and negative signal balls 582 and 586, respectively, to provide positive and negative electrical paths, respectively.

It is to be appreciated that the substrates according to exemplary embodiments of the invention may be packaged as integrated circuit chips integrated in relatively small packages to construct radio frequency (RF) or wireless communications chips, for example. For example, FIGS. 4 and 5 may be a schematic perspective view of integrally packaging an antenna and an integrated circuit chip, a chip to another chip, or a single chip to its package only. In such case, the circuit pads enable connection of an antenna such as a dipole antenna to an integrated antenna feed network such as a differential feed, which is connected to an integrated circuit of the integrated circuit chip. The feed network framework varies, depending on, for example, the impedance that is desired for the given application and/or the type of devices to which the chip will be connected.

It is to be understood that the exemplary embodiments of FIGS. 4-5 are merely illustrative embodiments of packaging a substrate, and that one of ordinary skill in the art may readily envision other frameworks based on the teachings herein.

Figure 6:
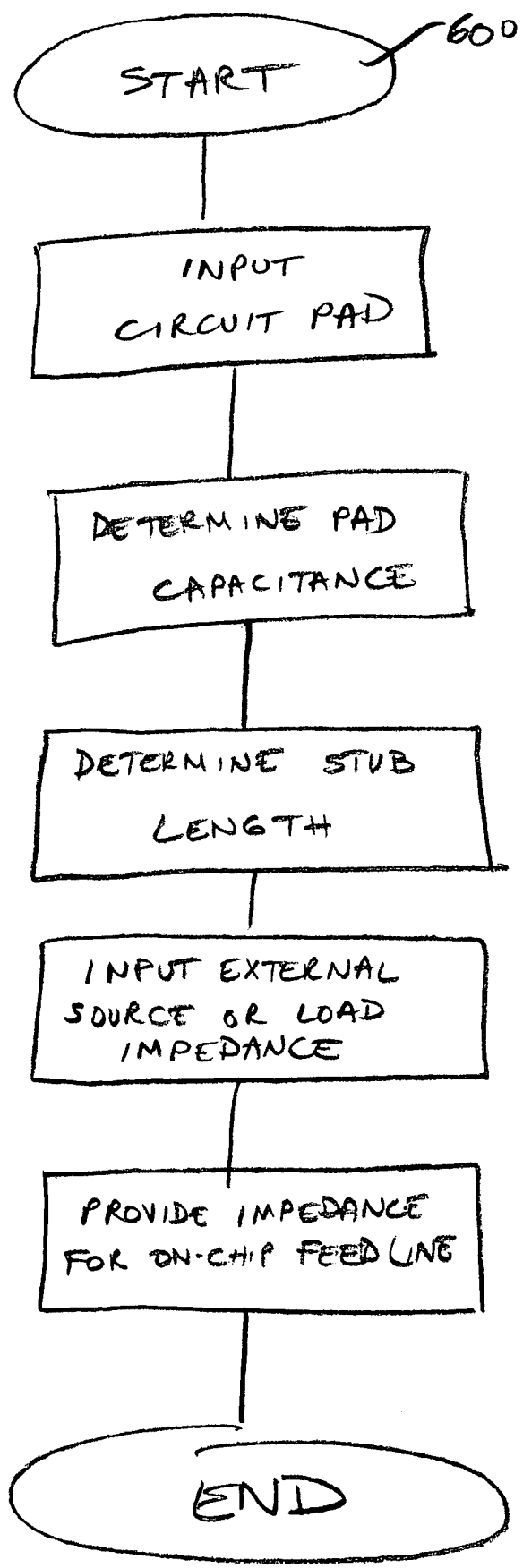
FIG. 6 illustrates a flow chart of an exemplary method of tuning out parasitic capacitance in accordance to an exemplary embodiment of the present invention.

FIG. 6 illustrates a flow chart of an exemplary method of tuning out parasitic capacitance in accordance to an exemplary embodiment of the present invention. Beginning at step 600, control proceeds to step 610, where the circuit pad is input to a tuning system for tuning out parasitic capacitance. Next, in step 620, the pad capacitance is determined. It should be appreciated that the pad capacitance may be determined through electromagnetic simulations or measurements. Control then proceed to step 630.

In step 630, the required stub length to be connected to the circuit pad is determined. It should be appreciated that analytical calculations or electrical transmission line models in a simulator may be used to find the required stub length in accordance with the various exemplary embodiments of this invention. It should be appreciated that, in accordance with the various exemplary embodiments of this invention, the length of the transmission line stub is chosen such that the pad capacitance is resonated.

Next, in step 640, the external source or load impedance is input. As discussed above, in various applications, the external off-chip source or load impedance may be chosen to be 50 Ohm. Then, in step 650, the external source or load impedance is provided as the impedance for the on-chip feed line. Thus, if the on-chip feed line is chosen in such a way that it has the same characteristic line impedance of 50 Ohm as the off-chip source or load impedance, then the off-chip source or load impedance will also be visible at the other end of the feed line where it is connected to on-chip circuits. This impedance will be independent of the length of the feed line, therefore the length of the feed line does not matter and does not have to be considered in any impedance matching network.

Control then proceed to step 660 where the process ends.

It should be appreciated that the substrate and the integration of the substrate in packages according to the present invention enable a multitude of applications such as integrated phased array systems, personal area networks, radar feeds, high reliability due to redundancy, point-to-point systems, etc. Moreover, the use of integrated circuit chip packages according to the present invention saves significant space, size, cost and weight, which is a premium for virtually any commercial or military application.

Although exemplary embodiments have been described herein with reference to the accompanying drawings for purposes of illustration, it is to be understood that the present invention is not limited to those precise embodiments, and that various other changes and modifications may be affected herein by one skilled in the art without departing from the scope of the invention

What is claimed is:

1. A device, comprising:
   a substrate;
   a circuit pad on the substrate, said pad having a determined capacitance and frequency bandwidth from 50 to 70 GHz;
   shunt transmission line stub attached to the circuit pad and of a line stub length whereby said determined pad capacitance is resonated to tune out parasitic capacitance in the substrate; and
   a shield beneath the circuit pad and beneath the shunt transmission line stub and electrically insulated therefrom.

2. The device of claim 1, wherein the substrate comprises a lossy substrate.

3. The device of claim 1, wherein the device is provided in milli-meter wave applications.

4. The device of claim 1, wherein the shunt transmission line stub is shorted to the shield.

5. The device of claim 4, wherein the shunt transmission line stub is shorted to the shield by one of a capacitor or a straight via to tune out parasitic capacitance.

6. The device of claim 1, further comprising a spacing between the circuit pad and the shield, wherein the spacing is minimized.

7. The device of claim 1, further comprising controlled impedance.

8. The device of claim 7, further comprising a feed line to the circuit pad, wherein the feed line comprises same characteristic line impedances as off-chip load impedances.

9. The device of claim 1, further comprising a second substrate, a second circuit pad on the second substrate, a second shield beneath the second circuit pad, and a second shunt transmission line stub attached to the second circuit pad, wherein the device comprises a differential pad structure having a ground pad between the first circuit pad and the second circuit pad.

10. An integrated circuit package, comprising:
    an integrated chip;
    a grounding pad on the integrated chip;
    a circuit pad on the integrated chip said pad having a determined capacitance and frequency bandwidth from 50 to 70 GHz;
    shunt transmission line stub attached to the circuit pad and of a line stub length whereby said determined pad capacitance is resonated to tune out parasitic capacitance between the circuit pad and the shield;
    a shield beneath the circuit pad and beneath the shunt transmission line stub and electrically insulated therefrom; and
    a lead frame connected to the circuit pad and the grounding pad on the integrated chip.

11. The integrated circuit chip package of claim 10, wherein the lead frame is connected to the circuit pad and the grounding pad by one of wire-bonding and flip-chip ball bonding.

* * * * *